United States Patent [19]

Voss et al.

[11] 3,766,450

[45] Oct. 16, 1973

[54] THYRISTOR

[75] Inventors: Peter Voss; Karl Platzoeder; Alfred Porst, all of Munich, Germany

[73] Assignee: Siemens Aktiengesellschaft, Berlin and Munich, Germany

[22] Filed: Aug. 14, 1972

[21] Appl. No.: 280,214

[30] Foreign Application Priority Data

Aug. 16, 1971 Germany.................. P 21 40 993.8

[52] U.S. Cl....................... 317/235 R, 317/235 WW

[51] Int. Cl............................................. H01l 11/00

[58] Field of Search.................................... 317/235

[56] References Cited

UNITED STATES PATENTS

| | | | |
|---|---|---|---|
| 3,476,989 | 11/1969 | Miles et al. | 317/235 |
| 3,408,545 | 10/1968 | DeCecco et al. | 317/235 |
| 3,662,233 | 5/1972 | Clerc et al. | 317/235 |
| 3,486,088 | 12/1969 | Gray et al. | 317/235 |
| 3,577,046 | 5/1971 | Moyson | 317/235 |

*Primary Examiner*—John W. Huckert
*Assistant Examiner*—E. Wojciechowicz
*Attorney*—Benjamin H. Sherman et al.

[57] ABSTRACT

A thyristor comprising a four-layer, monolithic device, which includes an emitter, a base, a second base below said base and a bottom layer forming an anode, a gate electrode on an exposed surface of said base, an auxiliary emitter laterally spaced from said emitter and forming with said base and said other layers an auxiliary thyristor, said second base having an area below the gate electrode and out to a point below an outer edge of the auxiliary emitter of higher impurity concentration than the remaining portion of said base. The auxiliary emitter is provided with an electrode which contacts its upper surface remote from the gate electrode and is in contact with the base. The emitter is provided with an electrode in contact with its upper surface remote from the auxiliary emitter and in contact with the base. By having the region of the second base underlying the gate electrode to a point below and inwardly of the outer edge of the auxiliary emitter of lower resistivity than that underlying the main emitter, the forward breakover voltage of the auxiliary thyristor is reached and the auxiliary thyristor ignited before any voltage is reached which would cause a direct triggering or gating of the main thyristor by a forward breakover voltage. The current flowing in the auxiliary thyristor thus causes a normal gating of the main thyristor as would be done by a gate electrode.

5 Claims, 4 Drawing Figures

THYRISTOR

BACKGROUND OF THE INVENTION

1. Field of the Invention

The invention relates to semiconductor thyristors and more particularly to semiconductor thyristors which include an auxiliary emitter.

2. Prior Art

A thyristor is a four-layer device in which the alternate layers are of opposite conductivity type. The layer of *n*-type conductivity at one end is usually referred to as the emitter or cathode. The *p*-type adjacent layer is usually referred to as the base. The next adjacent layer is sometimes referred to as a second base. The layer furthest from the emitter is usually referred to as the anode. A source of potential is arranged to be connected across the device, the anode being positive with respect to the emitter. A trigger or gate electrode is connected to the base, which when energized with a suitable positive signal with respect to the emitter, turns the device on. The device may also be turned on when a voltage exceeding the forward breakover voltage is applied between the anode and the emitter.

One common thyristor type is a four-layer block or chip of semiconductor material with the emitter diffused into the upper portion of the base as a ring-shaped area. This leaves the central portion of the block available at the upper surface of the block for contact with a gate electrode, which is formed thereon. An emitter electrode is formed on the upper surface of the emitter ring. The exposed surface of the anode is provided with a conductive film, which forms an anode electrode.

There has been a problem in the past when a thyristor of this general type is used to carry heavy current, due to destructive hot spots sometimes being developed when it is turned on with low gate currents.

It is desirable, however, for a thyristor to have a low triggering current requirement so as to reduce costs for the control circuit. If a low triggering current is fed into the control path of a thyristor of prior art types, a small, usually spherical or dot-shaped zone is activated initially. This dot-shaped zone must carry the entire load current and is thus subjected to a high specific stress. In turn, this causes overheating and destruction of the member in the dot-shaped zone. It was for this reason that an auxiliary emitter was suggested, which has the effect of forming an auxiliary thyristor with the two base layers and the second emitter or anode. With the auxiliary thyristor positioned between the gate electrode and the main thyristor, the auxiliary thyristor will be triggered first. The load current of the auxiliary thyristor will flow via the base towards the main thyristor and trigger it. The auxiliary emitter is dimensioned in such a way that the load current of the auxiliary thyristor causes a linear or a laminar-like gating of the main thyristor initially. When a main thyristor is ignited, the load current will only flow through the latter and the auxiliary thyristor will become extinguished.

Gating of the auxiliary thyristor before the main thyristor is assured with the above-described thyristor only when the gating current for the thyristor flows via the trigger or gate electrode. This, however, is not always the case. As is well known, a thyristor can also be ignited by applying a voltage across the thyristor which exceeds the forward breakover voltage. This type of ignition is obtained when the forward breakover voltage is exceeded due to an avalanche breakthrough of the blocking pin junction. In other words, when an applied voltage exceeds the breakover voltage of the thyristor, the thyristor switches from a blocking condition to a conducting condition. It is not assured, however, that with breakover ignition the auxiliary thyristor will gate first. Thus, if the main thyristor gates first, it will be triggered in a dot-shaped zone and thus the thyristor will be destroyed since the current density is high.

SUMMARY OF THE INVENTION

The present invention provides a novel arrangement of a thyristor embodying an auxiliary emitter in which gating of the auxiliary thyristor always takes place ahead of the main thyristor even when the forward breakover voltage of the thyristor is exceeded.

It is a novel feature of the present invention to have a select area of a second base in a thyristor lying inwardly of the point below the outer edge of the auxiliary emitter formed with a higher impurity concentration than that of the second base portions lying outwardly of such area.

It is a further feature of the present invention to have a predetermined relative relationship between the resistivity of the select area (of the second base) lying inwardly of the outer edge of the auxiliary emitter and the resistivity of the base portion underlying the main emitter. In preferred embodiments, the resistivity of the select area is about 10 to 30 percent lower than that of other base areas.

It is a further feature of the present invention to provide a thyristor of novel construction having an auxiliary emitter in which the forward breakover voltage of the auxiliary thyristor is lower than the forward breakover voltage of the main thyristor.

DETAILED DESCRIPTION OF THE PREFERRED EMBODIMENTS

Figure 1:
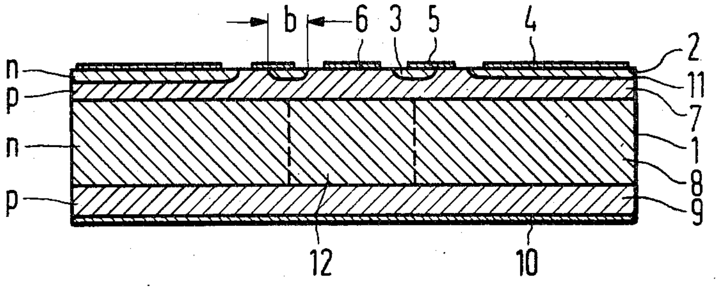
FIG. 1 is a sectional view of a thyristor embodying the novel teachings of the present invention.

In FIG. 1 of the drawings, there is shown a thyristor comprising a semiconductor chip or block 1 having four diffused layer regions 2–3, 7 8 and 9 of alternate impurity concentration type. By way of example, the uppermost diffused layer 2–3 and the third layer 8 from the top may be of *n*-type impurity doping while the second layer 7 and the bottom layer 9 may be of *p*-type impurity doping. The top layer 2–3 is not a complete layer, but is rather a diffused ring-shaped region 2 which forms the main emitter and at least one inner ring-shaped region 3 which forms an auxiliary emitter. The remaining portion of the second layer 7, hereinafter referred to as the base, over which neither the emitter 2 lies nor the emitter 3 lies, has its upper surface free of the top layer 2–3.

The main emitter 2 is provided with an emitter electrode 4, while the auxiliary emitter 3 is provided with an electrode 5 which overlies and contacts at least part of the upper surface of the auxiliary emitter 3 and extends out into electrical contact with base 7. A trigger or gate electrode 6 is formed on the free surface of the base 7 at the center of the chip or block 1 (i.e., the center of the ring-shaped emitters 2 and 3). An anode electrode 10 is formed on the undersurface of anode layer 9.

In accordance with the present invention, a select central area 12 of the second base or layer 8 is provided with a substantially higher impurity concentration than the remaining portions of layer 8. The purpose of this will hereinafter be explained.

Figure 2:
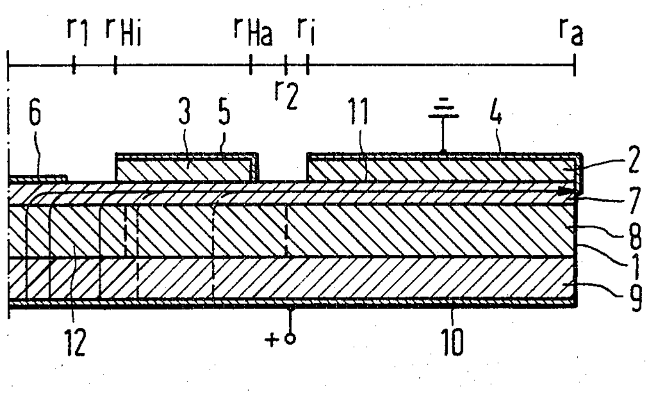
FIG. 2 is a fragmentary enlarged sectional view of a thyristor embodying the present invention.

In FIG. 2 of the drawings, there is fragmentarily shown a thyristor generally similar in construction to that of FIG. 1. The embodiment here shown is in the form of a circular disk or the like (only a quarter-sectional view being illustrated) having a central axis C and a radius extending from the center C to the outer edge $r_a$. Generally, the thyristor comprises a semiconductor member 1 having four layers 2–3, 7, 8 and 9 of respective opposite impurity concentration. By way of example, the semiconductor member 1 may be formed of a chip or block of silicon with an *n*-type main emitter 2, an auxiliary *n*-type emitter 3, a *p*-type base layer 7, an *n*-type base layer below the *p*-type base layer 7 and a bottom *p*-type layer 9. The emitter 2 is provided with an electrode 4, which lies over the upper surface of the emitter 2 and extends down over an edge of emitter 2, which is remote from the auxiliary emitter 3. The portion of the electrode 4 which extends down over the edge of emitter 2 extends over a portion of the outer edge of the base layer 7 and forms an electrical contact therewith. The auxiliary emitter is provided with an electrode 5 which extends over the upper surface of auxiliary emitter 3 and down over the edge of auxiliary emitter 3 which is remote from the gate electrode 6, into contact with the base layer 7. As clearly shown in FIG. 2, the auxiliary emitter 3 is spaced from the main emitter 2. FIG. 2 illustrates a radial sectional view extending from the center of the block at the left-hand edge of the figure to the outer peripheral surface of the block.

A gate electrode 6 is formed on an electrical contact with the central portion of base 7. An anode electrode 10 may be formed of molybdenum, for example. This electrode 10 is arranged to be connected to the source of positive potential while the main emitter electrode 4 is arranged to be connected to ground, for example. For ready reference, there is indicated in FIG. 2 the radial location of certain edge portions of the main emitter 2 and the auxiliary emitter 3. Specifically, the radial inner edge of the auxiliary emitter 3 is identified as $r_{Hi}$. The radial outer edge of the auxiliary emitter 3 is indicated as being located at $r_{Ha}$. The inner edge of the main emitter 2 is located by the designation $r_i$ and the outer edge of the main emitter 5 is located by the designation $r_a$. As is well known for thyristor technology, there is a *pn* junction formed between the layer containing main emitter 2 and base layer 7 and between auxiliary emitter 3 and base layer 7. These *pn* junctions are designated with the numeral 11. There is, of course, another *pn* junction between the layer 7 and the layer 8 and there is also a *pn* junction between the layer 8 and the layer 9.

It will be noted in FIG. 1 that the width of the auxiliary emitter 3 is shown by the notation "*b*". When reference is made to the width of the auxiliary emitter 3 or to the width of the main emitter 2, it refers to the distance between the inner and outer edges of the respective rings.

In order that an auxiliary thyristor formed by the auxiliary emitter 3 and the three successive layers deposited therebelow will ignite first when a voltage is applied across the main terminals of the thyristor which exceeds the forward breakdown voltage, the select area of layer 8 located below the gate electrode 6 and extending to a point below the auxiliary emitter 3 is given a much higher impurity concentration. This lowers the resistivity of the semiconductor material in the zone or area identified by reference numeral 12.

The width of the auxiliary emitter which is designed "*b*" is, for instance, about 1 mm. However, the width may be as much as 10 mm. The width of the area 12, which has a lower specific resistance, may amount to 16 mm. For instance, the specific resistance in area 12 may be about 30 percent lower than the specific resistance of the other areas of layer 8. If the specific resistance of the area 1 is, for instance, 25 percent below the specific resistance of the rest of the areas of base 8, a forward breakover voltage will occur at area 12. Such breakover voltage lies approximately 10 percent below the forward breakover voltage of the remaining areas of layer 8. With usual doping concentration in the base layer 8 of $10^{14}$ to $10^{16}$ $cm^{-3}$, a doping concentration in base layer 7 of $10^{16}$ to $10^{18}$ $cm^{-3}$ and a doping concentration in emitter 2 and the auxiliary emitter 3 of $10^{18}$ and $10^{20}$ $cm^{-3}$, it is possible to insure that the auxiliary emitter is triggered ahead of the main emitter.

The mode of operation is explained with the aid of FIG. 2. When a voltage having the polarity indicated and which is larger than that of the forward breakdown voltage of the thyristor in area 12, is applied to the electrodes 10 and 4, an avalanche breakthrough will occur in this area due to charge-carrier-multiplication. The current flowing in this area proceeds in the direction of the arrows along the pn junction 11 towards electrode 4. This current flows just below the pn junctions, since such border area of the base layer 7 contains the highest doping concentration and the specific resistance is lowest. Under the pn junction 11 a potential gradient U(*r*) occurs which is dependent on the radius illustrated in FIG. 3. It is referenced to the potential U(*o*) under the trigger electrode 6.

Figure 4:
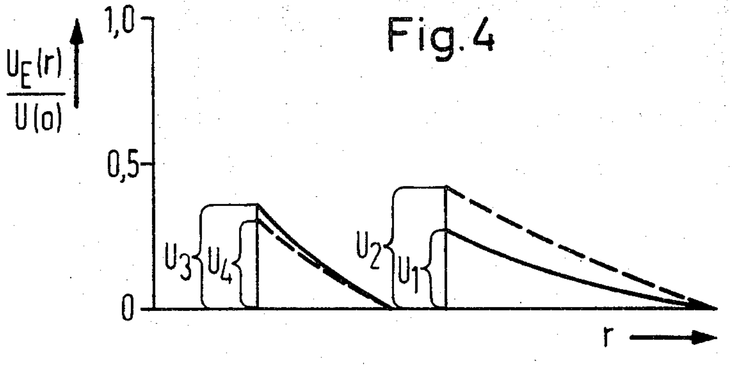
FIG. 4 is a graph of the voltage at the main emitter and the auxiliary emitter.

The voltage across the main and the auxiliary emitter decreases as a function of their radii at the pn junction 11 and this relation is illustrated in FIG. 4. This voltage is also referenced to the potential U(*o*) below the trigger electrode 6. The voltage at the left edge of the auxiliary emitter 3 (radius $r_{Hi}$) is denoted U3 and the voltage at the left edge of the emitter 2 (ridius $r_i$) by U1. It is obvious that the voltage U3 is larger than the voltage U1. The voltage U3 may, for instance, have a value of 0.45 V and the voltage U1 a value of 0.35 V. Since the voltage which is required for triggering the thyristor can, for instance, have 0.45 V at the pn junction, it becomes obvious that the auxiliary thyristor triggers while the voltage at *pn* junction 11 below the emitter 2 remains lower than that required for triggering the main thyristor.

Upon triggering of the auxiliary thyristor, its load current flows via electrode 5 into the base layer 7 and then to the emitter layer 2. The low current of the auxiliary thyristor forms a strong control current for the main thyristor so that it triggers in a line-shaped (i.e.

linear) manner. An overloading of the auxiliary thyristor cannot occur, since current acceptance by the main thyristor takes place very quickly. The auxiliary thyristor ceases to remain active after the main thyristor is triggered.

Figure 3:
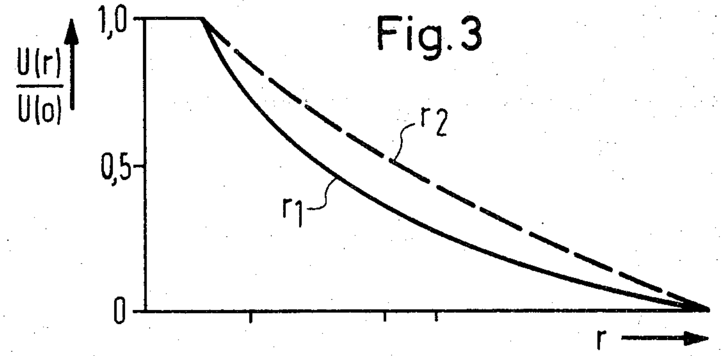
FIG. 3 is a graph showing the potential distribution in the structure of FIG. 2 as a function of the radius.

When the area 12 is formed with a larger radius, for instance, the radius $r_2$ (FIG. 2), the voltage breakthrough will take place within a much larger area. This is demonstrated by wider current paths, whose flow into the base 7 is illustrated by the dotted lines. At this point, for instance, a potential distribution below the *pn* junction 11 is created, such as illustrated in FIG. 3 by a broken line $r_2$. The voltage curve at the *pn* junction 11 is also shown in a broken line for the emitter 2 and the auxiliary emitter 3 in FIG. 4. The voltage at the left edge of the emitter 2 (radius $r_i$) is denoted U2 and the voltage at the left edge of the auxiliary emitter 3 (radius $r_{Hi}$) is denoted U4. It is obvious that in this case the main thyristor triggers first, because the voltage at the *pn* junction of the auxiliary thyristor remains lower than the voltage which is required for triggering the auxiliary thyristor. Since now only a spherical or dot shaped zone of the main thyristor is turned on, a thermal overloading of the main thyristor can occur at this point and thus destroy the main thyristor.

As shown by FIGS. 2 and 4, the inclination of the auxiliary emitter to trigger can also be controlled by the width of the auxiliary emitter. An increase of the auxiliary emitter width causes a similar increase of voltage at the *pn* junction at the left edge of the auxiliary emitter, since the voltage is determined by the difference of potential between the right edge (radius $r_{Ha}$) and the left edge (radius $r_{Hi}$). However, the width of an auxiliary emitter is limited by the width of the main emitter. The main emitter must be sufficiently large to carry the current load and an extremely enlarged auxiliary emitter limits the surface area of a thyristor available for a main emitter.

As is apparent from the foregoing specification, the present invention is susceptible of being embodied with various alterations and modifications which may differ from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the heretoappended claims.

We claim as our invention:

1. A thyristor comprising a monolithic semiconductor device with at least four zones of alternate conductivity type; a first zone being a main emitter and an auxiliary emitter laterally spaced from each other, a second zone being a first base, and a third zone being a second base, a gate electrode in contact with said first base and spaced from said auxiliary emitter, an electrode in contact with said auxiliary emitter remote from said gate electrode and in contact with said first base, and an electrode in contact with said main emitter remote from said auxiliary emitter and in contact with said first base, said second base having an area below said gate electrode and out to a point inward of an outer edge of said auxiliary emitter having sufficient impurity concentration to provide a resistivity to said area about 10 to 30% lower than the resistivity of the remaining areas of said second base.

2. A thyristor according to claim 1 in which the auxiliary emitter has a width up to 10 mm. and the low resistivity area of the second base has a width up to 16 mm.

3. A thyristor comprising a semiconductor member having at least four zones of alternate conductivity, a first zone being an emitter and an auxiliary emitter laterally spaced from each other, a second zone being a first base, a third zone being a second base, said emitter having an electrode thereon and said first base having a gate electrode thereon, said auxiliary emitter being positioned between said emitter and said gate electrode and electrically connected with said first base, said auxiliary emitter forming with said first base and said other zones an auxiliary thyristor, said second base having an area below said gate electrode and out to a point not beyond the location of the outer edge of said auxiliary emitter of a higher impurity concentration than the remaining areas of said second base, the specific resistivity of the higher impurity concentration area of the second base is at least 10 to 30 percent lower than the specific resistivity of the remaining portion of the second base.

4. A thyristor comprising a semiconductor member having at least four zones of alternate conductivity, a first zone being an emitter and an auxiliary emitter laterally spaced from each other, a second zone being a first base, a third zone being a second base, said emitter having an electrode thereon and said first base having a gate electrode thereon, said auxiliary emitter being positioned between said emitter and said gate electrode and electrically connected with said first base, said auxiliary emitter forming with said first base and said other zones an auxiliary thyristor, said second base having an area below said gate electrode and out to a point not beyond the location of the outer edge of said auxiliary emitter of a higher impurity concentration than the remaining areas of said second base, the specific resistance of the higher impurity con-centration area of the second base is approximately 25 percent under the specific resistivity of the remaining portion of said second base.

5. A thyristor comprising a semiconductor member having at least four zones of alternate conductivity, a first zone being an emitter and an auxiliary emitter laterally spaced from each other, a second zone being a first base, a third zone being a second base, said emitter having an electrode thereon and said first base having a gate electrode thereon, said auxiliary emitter being positioned between said emitter and said gate electrode and electrically connected with said first base, said auxiliary emitter forming with said first base and said other zones an auxiliary thyristor, said second base having an area below said gate electrode and out to a point not beyond the location of the outer edge of said auxiliary emitter of a higher impurity concentration than the remaining areas of said second base, the zones being doped, the doping concentration of the emitters being between $10^{18}$ and $10^{20}$ $cm^{-3}$, the doping concentration of the first base being between $10^{16}$ and $10^{18}$ $cm^{-3}$, and the doping concentration of the second base outside of said area of higher impurity concentration being between $10^{14}$ and $10^{16}$ $cm^{-3}$.

* * * * *